(12) United States Patent
Labbe

(10) Patent No.: US 8,358,122 B2
(45) Date of Patent: Jan. 22, 2013

(54) CURRENT SENSOR WITH LAMINATED MAGNETIC CORE

(75) Inventor: Arnaud Labbe, Saint-Julien-en-Genevois (FR)

(73) Assignee: Liaisons Electroniques-Mecaniques Lem SA, Plan-les-Ouates (CH)

( * ) Notice: Subject to any disclaimer, the term of this patent is extended or adjusted under 35 U.S.C. 154(b) by 287 days.

(21) Appl. No.: 12/735,141

(22) PCT Filed: Dec. 17, 2008

(86) PCT No.: PCT/IB2008/055376
§ 371 (c)(1),
(2), (4) Date: Jun. 17, 2010

(87) PCT Pub. No.: WO2009/077991
PCT Pub. Date: Jun. 25, 2009

(65) Prior Publication Data
US 2010/0259248 A1    Oct. 14, 2010

(30) Foreign Application Priority Data

Dec. 18, 2007   (EP) .................................... 07024511

(51) Int. Cl.
*G01R 15/20*   (2006.01)
*G01R 15/18*   (2006.01)
(52) U.S. Cl. .................................... 324/117 H; 324/127
(58) Field of Classification Search .................. None
See application file for complete search history.

(56) References Cited

U.S. PATENT DOCUMENTS

| 5,176,946 | A | | 1/1993 | Wieloch | |
|---|---|---|---|---|---|
| 6,005,383 | A | * | 12/1999 | Savary et al. | 324/117 H |
| 6,686,730 | B2 | * | 2/2004 | Marasch et al. | 324/117 R |
| 6,750,644 | B1 | * | 6/2004 | Berkcan | 324/117 R |
| 6,788,046 | B2 | * | 9/2004 | Lenhard et al. | 324/117 R |
| 2005/0237049 | A1 | | 10/2005 | Ozaki et al. | |

FOREIGN PATENT DOCUMENTS

| EP | 1 767 952 A | 3/2007 |
|---|---|---|
| GB | 568 473 A | 4/1945 |
| JP | 58 165308 A | 9/1983 |

OTHER PUBLICATIONS

Search Report and Written Opinion for PCT/IB2008/055376 issued by the European Patent Office on Apr. 16, 2009.

* cited by examiner

*Primary Examiner* — Vinh Nguyen
(74) *Attorney, Agent, or Firm* — Faegre Baker Daniels LLP

(57) ABSTRACT

An electrical current sensor (2) comprising a magnetic core (6) with an air gap (14), a magnetic field detector (8) positioned at least partially in the air gap, and a conductive mounting element (10). The mounting element comprises at least first and second fixing extensions (56) extending between opposed outer faces of the magnetic circuit, and a bridge portion (34) interconnecting the fixing extensions and spanning across the air gap. The bridge portion comprises an electrical terminal (42) in electrical contact with a grounding pad (24) of the magnetic field detector.

20 Claims, 3 Drawing Sheets

CURRENT SENSOR WITH LAMINATED MAGNETIC CORE

The present invention relates to an electrical current sensor with a magnetic field detector positioned in an air gap of a laminated magnetic core.

Current sensors with laminated magnetic cores and magnetic field detectors positioned in an air gap of the core are well-known and used widely. The magnetic core is intended to be positioned around a conductor through which the current to be measured flows. The magnetic induction generated by the electrical current is measured by a magnetic field detector positioned in the air gap of the magnetic core. In order to reduce Eddy currents, many magnetic cores are typically made of a plurality of stacked sheets in a material with a high magnetic permeability, such as soft iron nickel alloys. The stacked sheets forming the magnetic core are typically held together by an embossing and welding operation at certain points around the core. One of the commonly used magnetic field detectors are Hall sensors that are in the form of an integrated circuit (ASIC) for mounting on a printed circuit board. The circuit board may comprise further signal processing circuitry and/or connection terminals for connection of the current sensor to an external unit for signal processing and power supply. It is known to insert a portion of the circuit board with the magnetic field detector mounted thereon in the air gap of the magnetic core, the assembly of the magnetic field detector and magnetic circuit being held within a housing that may be closed or sealed with a resin potting. An example of such current sensors is described for instance in US 2005/0237049.

In certain applications sensors are subject to high thermal and/or mechanical stresses due to mechanical shock, vibration, and temperature variations in the sensor environment. These stresses, as well as ageing of materials and components, lead to inaccuracy in the current measurement over time.

In conventional laminated magnetic cores, shock, vibration and thermal stresses may lead to a deterioration of the welding holding the stacked sheets, further possible problems being changes in the size of the air gap and a shift of the magnetic field detector in the air gap from its initial position. A loosening of the stacked plates of the magnetic core may lead to changes in the magnetic induction that are not accounted for.

It is an object of this invention to provide an electrical current sensor that is reliable, accurate, and resistant to stresses resulting from vibration, shock or temperature variations.

It is advantageous to provide an electrical current sensor that is economical to manufacture and assemble.

Objects of this invention have been achieved by providing the electrical current sensor according to claim 1.

Disclosed herein is an electrical current sensor comprising a magnetic core with an air gap, a magnetic field detector positioned at least partially in the air gap, and a conductive mounting element comprising at least first and second extensions extending between opposed faces of the magnetic core, and a bridge portion interconnecting the extensions and spanning across the air gap, the bridge portion comprising an electrical terminal in electrical contact with a grounding terminal of the current sensor.

Free ends of the extensions are preferably crimped over an outer surface of the magnetic core opposite a surface of the magnetic core in abutment against the bridge portion of the mounting element. The extensions thus serve to secure together the stacked sheets forming the magnetic core in addition or instead of welding or other fixing means. The crimped over extensions ensure reliable securing together of the sheets in the presence of shock or vibration.

The conductive mounting element also advantageously serves to earth the magnetic circuit to avoid potential differences between the magnetic core, magnetic field detector, and an external unit from affecting the current signal measurement.

The mounting element may advantageously comprise one or more mounting tabs inserted into corresponding cavities in a housing of the sensor for fixing and positioning the magnetic circuit and magnetic field detector within the housing.

The magnetic detector may advantageously be provided on a circuit board that also comprises a grounding pad forming the grounding terminal in electrical contact with the grounding terminal of the mounting element.

The grounding terminal of the mounting element may advantageously be in the form of an elastic arm configured to allow insertion of the magnetic field detector circuit board into pluggable contact with the mounting element grounding terminal.

The mounting element may advantageously be stamped and formed from sheet metal in an essentially planar configuration.

The mounting element may advantageously further comprise a positioning arm spaced from and opposite the grounding terminal, configured to clamp the circuit board of the magnetic field detector between the grounding terminal and positioning arm. The grounding terminal and/or positioning arm also serve as means for positioning the magnetic field detector within the air gap. The elastic grounding terminal also absorbs vibration and mechanical shock and assists in retaining the magnetic field detector in its correct position in the air gap.

The configuration of the mounting element also advantageously enables the magnetic field detector to be assembled by insertion into the sensor housing and through the air gap into pluggable connection between the grounding terminal and positioning arm, thus simplifying assembly operations and simultaneously ensuring grounding of the magnetic circuit and positioning of the magnetic field detector with respect to the air gap.

Further objects and advantages of the invention will be apparent from the claims, detailed description and annexed drawings in which:

Figure 1:
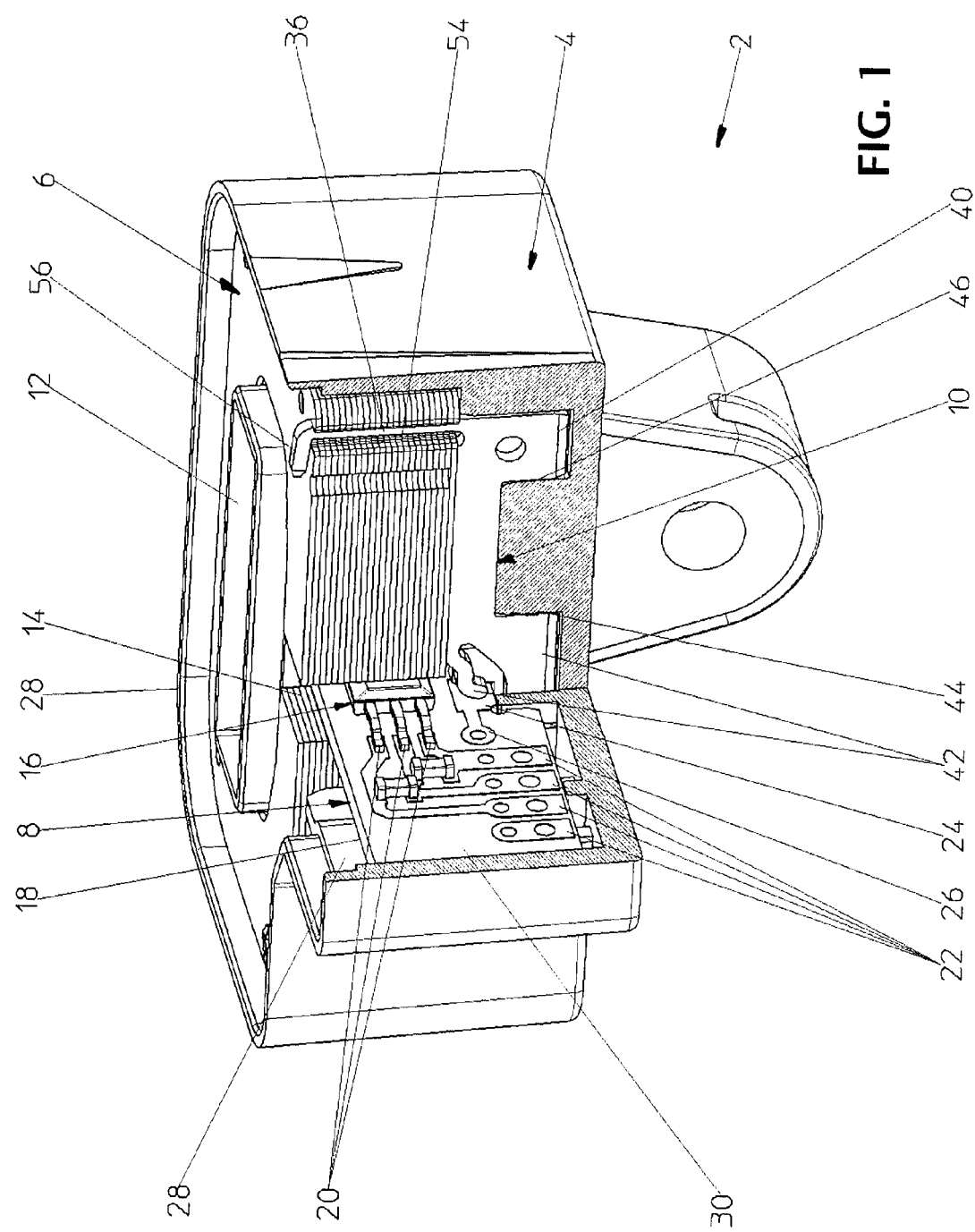
FIG. 1 is a partial cut away perspective view of a current sensor according to the invention.

Referring to the figures, an electrical current sensor 2 comprises a housing 4, a magnetic core 6, a magnetic field detector 8, and a mounting element 10.

The magnetic core is formed from a stack of sheets of a material with high magnetic permeability as is well-known in the art. The magnetic core surrounds an opening 12 intended to be traversed by a primary conductor (not shown) through which the current to be measured flows. The magnetic core 6 has an air gap 14, which in the embodiment illustrated completely traverses through the magnetic core. Within the scope of this invention the air gap could however also be a partial air gap whereby the magnetic core forms a closed or essentially closed magnetic circuit. The height H of the stack of sheets forming the magnetic core may vary, as illustrated in FIGS.

2a and 2b, depending on the intensity of the current to be measured. For cost and weight reasons, there is an advantage in adapting the height of the magnetic core depending on the application and the maximum specified current intensity to be measured, the principle limitation being to avoid saturation of the magnetic core that leads to non linearity in the current measurement.

The magnetic field detector 8 comprises a magnetic field sensor 16 and a circuit board 18 on which the magnetic field sensor 16 is mounted. The magnetic field sensor may for example be a Hall effect sensor in the form of an ASIC with contact terminals 20 connected to conductive tracks on the circuit board 18. Hall effect sensor chips are widely used, but other known magnetic field sensors could also be employed within the scope of this invention, such as giant magneto-resistive magnetic field sensors, fluxgate sensors, and other known magnetic field sensors. The magnetic field sensor does not necessarily need to be mounted on a circuit board: it could also be encapsulated or incorporated in a housing or other support structure with electrical terminals for connection to an external unit for processing the measurement signal and for earthing the sensor.

In the embodiment illustrated, the circuit board 18 provides not only support for the magnetic field sensor but also comprises some components for pre-processing of the measurement signal, and contact pads 22 that may be soldered or connected by other known means to pin or receptacle terminals (not shown) in a connector plug of the current sensor housing for connection to an external measurement signal processing unit. The circuit board 18 further comprises a grounding terminal, which in the embodiment illustrated is in the form of a grounding pad 24 interconnected to a terminal 26 for earthing the magnetic field detector and the magnetic core to avoid potential differences therebetween and with an external processing unit to which the electrical sensor is connected.

In the embodiment illustrated, a portion of the circuit board and the magnetic field sensor 16 is inserted into the housing and into the air gap 14 in an axial direction A corresponding to the axis of the central opening 12 for passage of the primary conductor. The magnetic field detector 8 is inserted into the housing and air gap 14 from an open end 28 of the housing after insertion of the magnetic core 6 and the mounting element 10 into the housing, all these parts being inserted into the housing in the axial direction A. The open end of the housing may be closed by a cover part (not shown) that is for example welded or otherwise fixed over the housing, and/or the housing is filled with a potting resin, to protect the components therein from the environment.

The housing is advantageously provided with guide surfaces or rails 28 in a slot shaped cavity portion receiving the circuit board 18. The guide surfaces 28 are in contact with the circuit board 18 at positions that are proximate an end 30 of the circuit board that is distant from the magnetic field sensor 16. Positioning and guiding of the opposed end of the magnetic field detector 8 in or proximate the air gap 14 is performed principally by the mounting element 10 as described in more detail herebelow.

The mounting element 10 comprises a bridging portion 34 and a pair of magnetic core fixing extensions 36 extending from opposed ends 38 of the bridging portion 34. The mounting element further comprises housing securing portions 40, 42, which in the embodiment illustrated are in the form of tabs that are inserted into corresponding cavities 44, 46 in the housing for positioning and fixing the mounting element and the magnetic circuit within the housing. At least one of the mounting tabs may advantageously be provided with barbs 48 or other anchoring elements for anchoring the mounting element 10 in the housing 4. The mounting element 10 further comprises an electrical grounding terminal 50 that may advantageously be in the form an elastic cantilever arm for elastically abutting against the grounding contact 24 of the magnetic field detector 8. There may further be a positioning protrusion 52 facing the grounding terminal 50 and separated therefrom by a gap adapted for insertion of the circuit board 18 therebetween in a compression fit, whereby the positioning protrusion 52 serves as a reference for guiding and positioning the magnetic field detector 8 as it is inserted into the air gap 14 and thereafter during operation of the sensor.

The positioning protrusion 52 may have an identical or similar shape to the grounding terminal 50 or may have a different shape with more or less rigidity than the grounding terminal depending on the amount of elasticity and contact pressure desired or required between the mounting element grounding terminal 50 and the grounding terminal 24 of the magnetic field detector. Moreover, within the scope of the invention, it is possible to have a substantially rigid protrusion forming the grounding terminal and an elastic positioning protrusion. It is also possible to have both the grounding and positioning protrusions contacting groundings pads on opposed faces of the magnetic field detector 8. In the embodiment illustrated, the positioning protrusion 52 has a certain elasticity but that is less than the elasticity of the grounding terminal 50 so that it acts as a reference for positioning of the circuit board whereas the elastic grounding terminal 50 adjusts somewhat for tolerances in the thickness of the circuit board. The combined elasticity of the grounding terminal 50 and positioning arm 52 provides resistance to shock and vibration while ensuring integrity of the electrical connection between the mounting element and the grounding pad 42.

The mounting element 10 may advantageously be made from stamped sheet metal in an essentially planar configuration as illustrated in the figures, or in a non planar three dimensional configuration (not shown) for greater rigidity or for functional purposes.

Figure 2A:
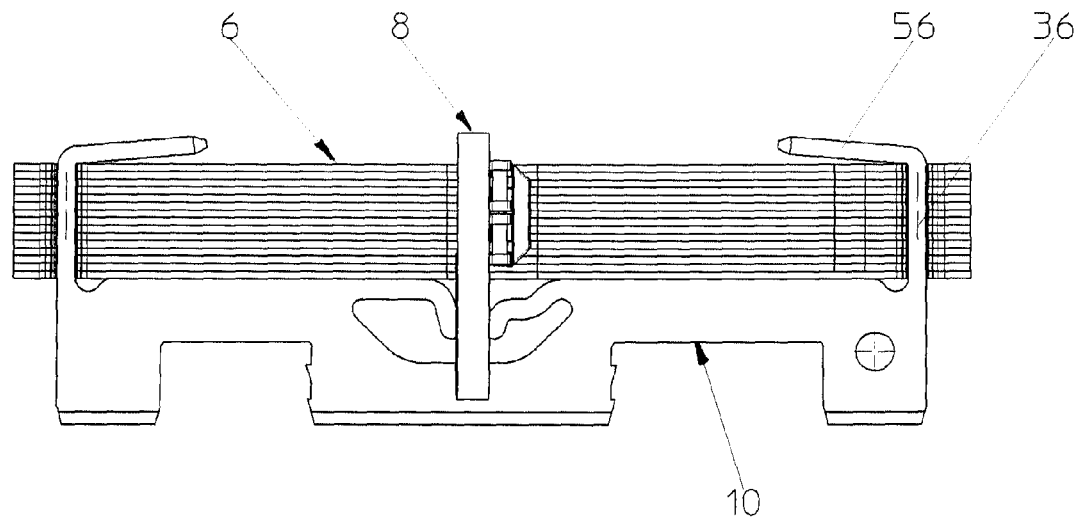
FIGS. 2a and 2b are views of a magnetic circuit with mounting element of a current sensor according to this invention, the magnetic circuits of FIGS. 2a and 2b having different heights.
Figure 2B:
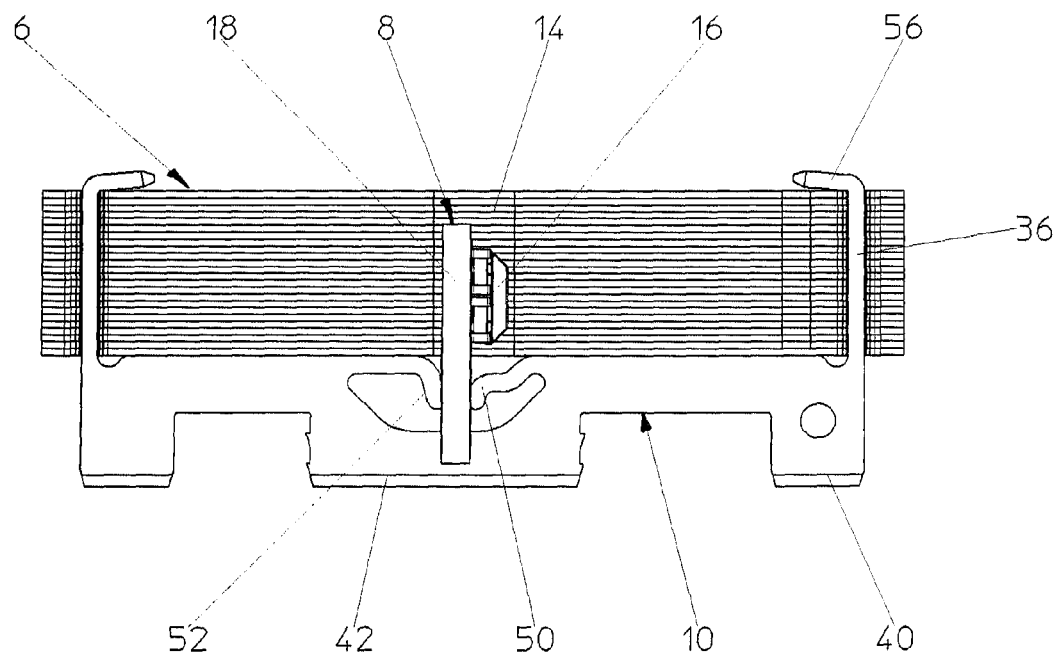
Figure 3:
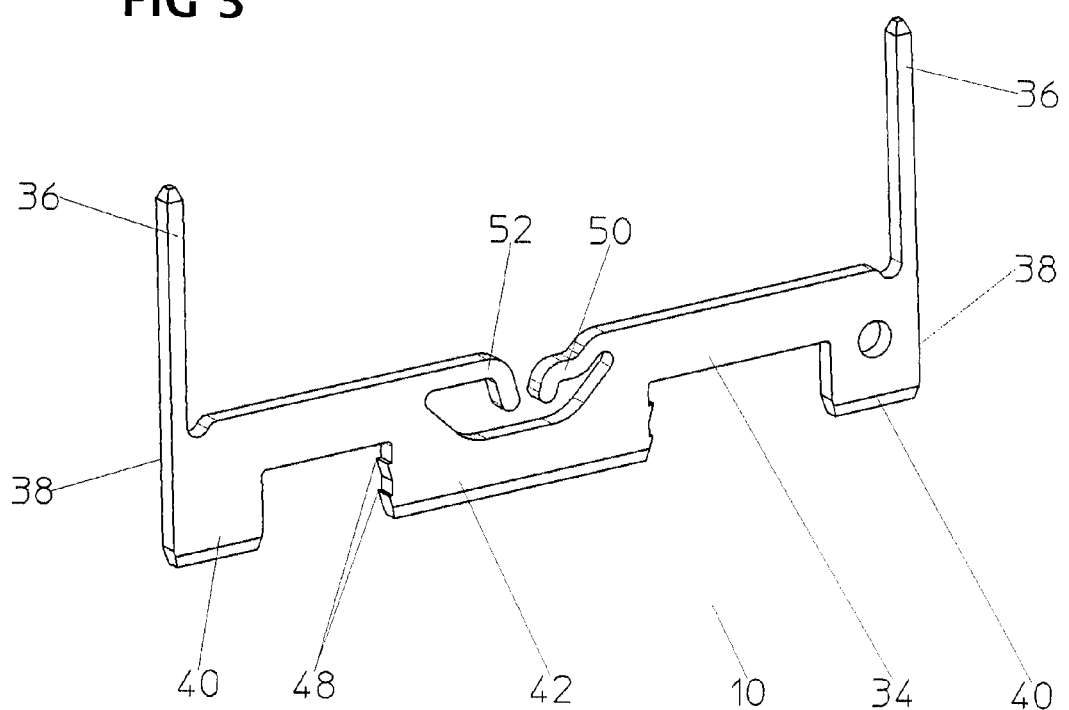
FIG. 3 is a perspective view of mounting element of the sensor shown in FIG. 1.

The fixing extensions 36 are inserted in corresponding open-sided grooves, or holes, through the stack of sheets forming the magnetic core. A free end portion 56 of each extension may be bent (as shown) or deformed in another manner over an outer layer of the magnetic circuit such that the stack of magnetic circuit sheets are clamped between the deformed end portion 56 and the bridging portion 34. The crimping operation may be easily adjusted to bend over the required length of the end portion of the extension taking into account the height of the stack of sheets forming the magnetic core, as best seen in FIGS. 2a and 2b. The clamping effect of the mounting portion on the magnetic core provides resistance to shock, vibration and thermal stresses and can be provided in addition or in replacement of conventional fixing means such as welding. Crimping of the extensions to the magnetic core also ensures a good electrical grounding connection between the magnetic core and the magnetic field sensor. The mounting element 10 securely fastened to the magnetic core also provides a secure and rigid mounting of the magnetic core to the housing, respectively to the magnetic field detector, as well as providing secure and accurate positioning of the magnetic field detector in the air gap.

What is claimed is:

1. An electrical current sensor comprising a magnetic core with an air gap, a magnetic field detector positioned at least partially in the air gap, and a conductive mounting element made of a conducting material comprising at least first and second fixing extensions, said first fixing extension extending between opposed outer faces of a portion of the magnetic core positioned on a first side of the air gap and said second fixing extension extending between opposed outer faces of a portion of the magnetic core positioned on a second side of the air gap, and a bridge portion interconnecting the fixing extensions and spanning across the air gap, the bridge portion comprising an electrical terminal in electrical contact with a grounding terminal of the magnetic field detector.

2. Current sensor according to claim 1, wherein free ends of the fixing extensions are crimped over one of said outer faces of the magnetic core.

3. Current sensor according to claim 1, wherein the electrical terminal comprises an elastic contact in abutment against a conductive pad of the grounding terminal of the magnetic field detector.

4. Sensor according to claim 1, wherein the mounting element is a stamped sheet metal part.

5. Sensor according to claim 4, wherein the mounting element is substantially planar.

6. Sensor according to claim 1, wherein the mounting element comprises one or more tabs received in corresponding cavities of a housing for positioning and fixing the mounting element and magnetic core in the housing.

7. Sensor according to claim 1, wherein the mounting element comprises a positioning protrusion facing the electrical terminal and separated therefrom by a gap configured for insertion of a portion of the magnetic field detector therebetween in an elastic compression between the electrical terminal and positioning protrusion.

8. Sensor according to claim 7, wherein the positioning protrusion is in the form of a cantilever arm.

9. Sensor according to claim 1, wherein the electrical terminal is in the form of an elastic cantilever arm.

10. Sensor according to claim 1, wherein the magnetic field detector comprises a circuit board and a magnetic field sensor mounted on the circuit board.

11. Sensor according to claim 10, wherein the grounding terminal of the magnetic field sensor comprises a conductive pad against which the electrical terminal of the mounting element abuts.

12. An electrical current sensor comprising a magnetic core with an air gap, a magnetic field detector positioned at least partially in the air gap, and a conductive mounting element comprising at least first and second fixing extensions extending between opposed outer faces of the magnetic core, and a bridge portion interconnecting the fixing extensions and spanning across the air gap, the bridge portion comprising an electrical terminal in electrical contact with a grounding terminal of the magnetic field detector, wherein the electrical terminal comprises an elastic contact in abutment against a conductive pad of the grounding terminal of the magnetic field detector.

13. Current sensor according to claim 12, wherein free ends of the fixing extensions are crimped over one of said outer faces of the magnetic core.

14. Sensor according to claim 12, wherein the mounting element comprises one or more tabs received in corresponding cavities of a housing for positioning and fixing the mounting element and magnetic core in the housing.

15. Sensor according to claim 12, wherein the mounting element comprises a positioning protrusion facing the electrical terminal and separated therefrom by a gap configured for insertion of a portion of the magnetic field detector therebetween in an elastic compression between the electrical terminal and positioning protrusion.

16. Sensor according to claim 12, wherein the magnetic field detector comprises a circuit board and a magnetic field sensor mounted on the circuit board.

17. An electrical current sensor comprising a magnetic core with an air gap, a magnetic field detector positioned at least partially in the air gap, and a conductive mounting element comprising at least first and second fixing extensions extending between opposed outer faces of the magnetic core, and a bridge portion interconnecting the fixing extensions and spanning across the air gap, the bridge portion comprising an electrical terminal in electrical contact with a grounding terminal of the magnetic field detector, wherein the mounting element comprises one or more tabs received in corresponding cavities of a housing for positioning and fixing the mounting element and magnetic core in the housing.

18. Current sensor according to claim 17, wherein free ends of the fixing extensions are crimped over one of said outer faces of the magnetic core.

19. Current sensor according to claim 17, wherein the electrical terminal comprises an elastic contact in abutment against a conductive pad of the grounding terminal of the magnetic field detector.

20. Sensor according to claim 17, wherein the mounting element comprises a positioning protrusion facing the electrical terminal and separated therefrom by a gap configured for insertion of a portion of the magnetic field detector therebetween in an elastic compression between the electrical terminal and positioning protrusion.

* * * * *